United States Patent
Lin et al.

(10) Patent No.: US 8,941,204 B2
(45) Date of Patent: Jan. 27, 2015

(54) APPARATUS AND METHOD FOR REDUCING CROSS TALK IN IMAGE SENSORS

(75) Inventors: Jeng-Shyan Lin, Tainan (TW);
Dun-Nian Yaung, Taipei (TW);
Jen-Cheng Liu, Hsin-Chu (TW);
Tzu-Hsuan Hsu, Kaohsiung (TW);
Shuang-Ji Tsai, Guiren Township (TW);
Min-Feng Kao, Chiayi (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 221 days.

(21) Appl. No.: 13/458,827

(22) Filed: Apr. 27, 2012

(65) Prior Publication Data

US 2013/0285181 A1  Oct. 31, 2013

(51) Int. Cl.
*H01L 27/146* (2006.01)
*H01L 21/762* (2006.01)
*H01L 31/0232* (2014.01)

(52) U.S. Cl.
USPC .......... 257/446; 257/292; 257/E27.133; 257/E21.573; 438/73; 438/421

(58) Field of Classification Search
CPC ........... H01L 27/1463; H01L 27/1464; H01L 27/14643; H01L 27/14634
USPC ........... 257/291, 446.46, E27.133, E21.573, 257/432, 446, 292; 438/421, 73
See application file for complete search history.

(56) References Cited

U.S. PATENT DOCUMENTS

| | | | |
|---|---|---|---|
| 6,406,975 B1 * | 6/2002 | Lim et al. | 438/421 |
| 6,982,443 B2 * | 1/2006 | Hsu et al. | 257/226 |
| 7,015,116 B1 * | 3/2006 | Lo et al. | 438/437 |
| 8,440,495 B2 * | 5/2013 | Liu et al. | 438/73 |
| 2005/0199921 A1 * | 9/2005 | Hsu et al. | 257/290 |
| 2008/0217719 A1 * | 9/2008 | Liu et al. | 257/446 |
| 2009/0121306 A1 * | 5/2009 | Ishikawa | 257/438 |
| 2010/0155868 A1 * | 6/2010 | Jang | 257/432 |
| 2010/0181634 A1 * | 7/2010 | Wang et al. | 257/432 |
| 2010/0237451 A1 * | 9/2010 | Murakoshi | 257/432 |
| 2011/0186918 A1 * | 8/2011 | Sung | 257/292 |
| 2012/0025199 A1 * | 2/2012 | Chen et al. | 257/75 |
| 2014/0151835 A1 * | 6/2014 | Huang et al. | 257/432 |

* cited by examiner

*Primary Examiner* — Cheung Lee
*Assistant Examiner* — Jeremy Joy
(74) *Attorney, Agent, or Firm* — Slater & Matsil, L.L.P.

(57) ABSTRACT

A method for reducing cross talk in image sensors comprises providing a backside illuminated image sensor wafer, forming an isolation region in the backside illuminated image sensor wafer, wherein the isolation region encloses a photo active region, forming an opening in the isolation region from a backside of the backside illuminated image sensor wafer and covering an upper terminal of the opening with a dielectric material to form an air gap embedded in the isolation region of the backside illuminated image sensor wafer.

20 Claims, 12 Drawing Sheets

APPARATUS AND METHOD FOR REDUCING CROSS TALK IN IMAGE SENSORS

BACKGROUND

As technologies evolve, complementary metal-oxide semiconductor (CMOS) image sensors are gaining in popularity over traditional charged-coupled devices (CCDs) due to certain advantages inherent in the CMOS image sensors. In particular, a CMOS image sensor may have a high image acquisition rate, a lower operating voltage, lower power consumption and higher noise immunity. In addition, CMOS image sensors may be fabricated on the same high volume wafer processing lines as logic and memory devices. As a result, a CMOS image chip may comprise both image sensors and all the necessary logics such as amplifiers, A/D converters and the like.

CMOS image sensors are pixelated metal oxide semiconductors. A CMOS image sensor typically comprises an array of light sensitive picture elements (pixels), each of which may include transistors (switching transistor and reset transistor), capacitors, and a photo-sensitive element (e.g., a photo-diode). A CMOS image sensor utilizes light-sensitive CMOS circuitry to convert photons into electrons. The light-sensitive CMOS circuitry typically comprises a photo-diode formed in a silicon substrate. As the photo-diode is exposed to light, an electrical charge is induced in the photo-diode. Each pixel may generate electrons proportional to the amount of light that falls on the pixel when light is incident on the pixel from a subject scene. Furthermore, the electrons are converted into a voltage signal in the pixel and further transformed into a digital signal by means of an A/D converter. A plurality of periphery circuits may receive the digital signals and process them to display an image of the subject scene.

A CMOS image sensor may comprise a plurality of additional layers such as dielectric layers and interconnect metal layers formed on top of the substrate, wherein the interconnect layers are used to couple the photo diode with peripheral circuitry. The side having additional layers of the CMOS image sensor is commonly referred to as a front side, while the side having the substrate is referred to as a backside. Depending on the light path difference, CMOS image sensors can be further divided into two major categories, namely front-side illuminated (FSI) image sensors and back-side illuminated (BSI) image sensors.

In a FSI image sensor, light from the subject scene is incident on the front side of the CMOS image sensor, passes through dielectric layers and interconnect layers, and finally falls on the photo diode. The additional layers (e.g., opaque and reflective metal layers) in the light path may limit the amount of light absorbed by the photo diode so as to reduce quantum efficiency. In contrast, there is no obstruction from additional layers (e.g., metal layers) in a BSI image sensor. Light is incident on the backside of the CMOS image sensor. As a result, light can strike the photo diode through a direct path. Such a direct path helps to increase the number of photons converted into electrons.

Photodiodes may generate electrons in response to the light incident on the backside of a CMOS image sensor. However, a pixel may generate electrons even though light strikes the pixel's neighboring pixels. Such interference is commonly referred to as cross talk. Cross talk may reduce quantum efficiency of image sensors.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, a backside illuminated image sensor. The embodiments of the disclosure may also be applied, however, to a variety of image sensors and semiconductor devices. Hereinafter, various embodiments will be explained in detail with reference to the accompanying drawings.

Figure 1:
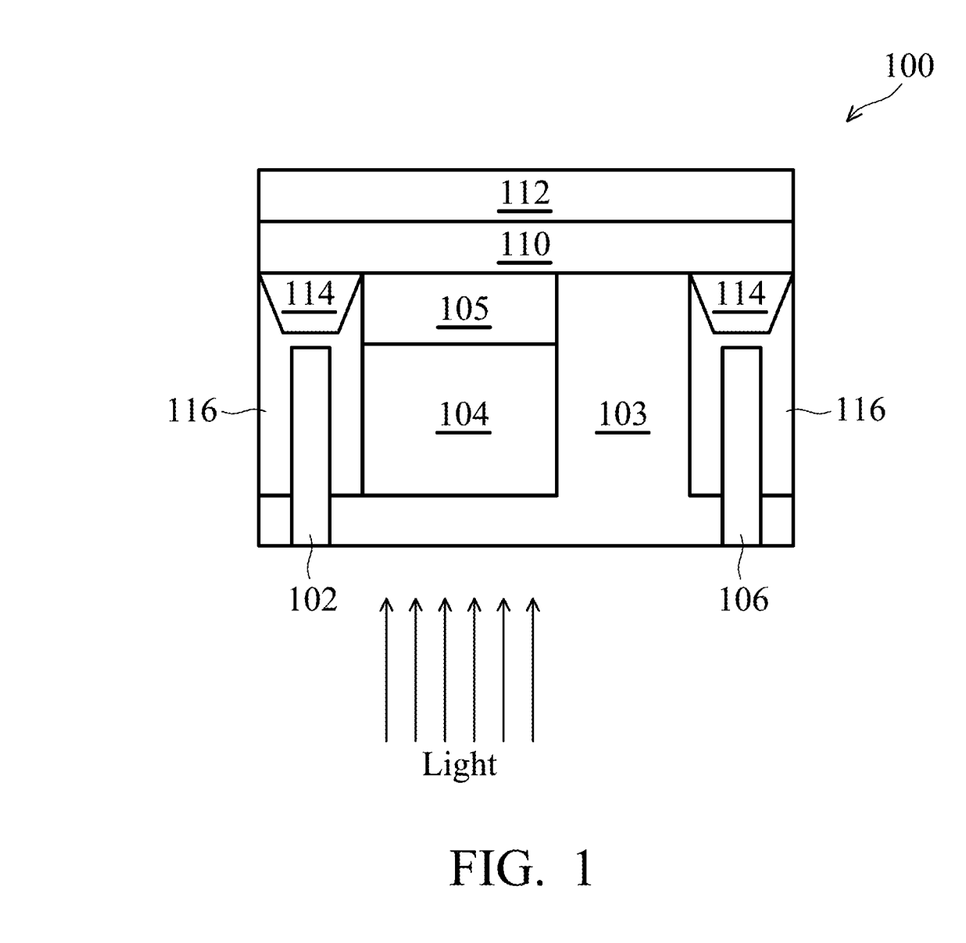
FIG. 1 illustrates a simplified cross sectional view of a backside illuminated image sensor in accordance with an embodiment.

FIG. 1 illustrates a simplified cross sectional view of a backside illuminated image sensor in accordance with an embodiment. The backside illuminated image sensor 100 is fabricated by CMOS process techniques known in the art. In particular, the backside illuminated image sensor 100 is formed in an epitaxial layer over a silicon substrate. According to the fabrication process of backside illuminated image sensors, the silicon substrate has been removed in a backside thinning process until the epitaxial layer is exposed. As shown in FIG. 1, a portion of epitaxial layer 103 remains. A p-type photo active region 105 and an n-type photo active region 104 are formed in the remaining epitaxial layer 103.

The photo active regions such as the p-type photo active region 105 and the n-type photo active region 104 may form a PN junction, which functions as a photodiode. In accordance with an embodiment, the photo active regions (e.g., the n-type photo active region 104 and the p-type photo active region 105) are formed in the epitaxial layer 103 grown from a p-type semiconductor substrate (not shown).

The backside illuminated image sensor 100 further comprises an isolation region 116 formed in the epitaxial layer 103. As shown in FIG. 1, the photodiode formed by the n-type photo active region 104 and the p-type photo active region 105 is enclosed by the isolation region 116. In particular, the isolation region 116 helps to prevent crosstalk and interference from adjacent pixels (not shown). In accordance with an embodiment, the isolation region 116 may be formed of p-type materials such as boron, $BF_2$ and the like. In addition, the isolation region 116 may comprise a shallow trench isolation (STI) structure 114. In accordance with an embodiment, the isolation region 116 has a doping depth extending from a front side of the epitaxial layer 103 in a range from about 0 um to about 2 um.

As shown in FIG. 1, there may be an air gap 102 formed in the isolation region 116. The air gap 102 helps to improve the quantum efficiency of the backside illuminated image sensor 100. In particular, when light strikes the isolation region 116, light may be reflected back towards the photo active regions (e.g., the n-type photo active region 104 and the p-type photo active region 105). The reflected light makes the backside illuminated image sensor 100 more efficient at capturing light and reducing or eliminating cross talk between different pixel regions (not shown). The detailed structure and formation process of the air gap 102 will be described below with respect to FIGS. 2-12.

The backside illuminated image sensor 100 may comprise a plurality of additional layers such as dielectric layer 110 and interconnect metal layer 112 formed over the substrate. For simplicity, hereinafter the side having additional layers of the backside illuminated image sensor 100 is referred to as a front side, while the side having the substrate is referred to as a backside.

A dielectric layer 110 is typically formed over the front side of the substrate. It should be noted that other circuitry (not shown), such as transistors, capacitors, or the like, may also be formed in the epitaxial layer 103. In accordance with an embodiment, the dielectric layer 110 forms a planarized layer upon which other layers (e.g., metal interconnect layers) may be formed. In an embodiment, the dielectric layer 110 may be formed of low-K dielectric materials such as silicon oxide, borophosphosilicate glass (BPSG), phosphosilicate glass (PSG), fluorinated silicate glass (FSG), carbon-doped silicon oxide or the like. The dielectric layer 110 may be formed by any suitable techniques such as chemical vapor deposition (CVD) techniques or the like.

A metal interconnect layer 112 may be formed over the dielectric layer 110. The metal interconnect layer 112 can be patterned by plasma etching or a damascene process and may be formed of any conductive material suitable for a particular application. Materials that may be suitable include, for example, aluminum, copper, doped polysilicon or the like. Contacts and vias (not shown) may be formed to provide electrical connectivity between the metal interconnect layer and underlying circuitry.

Figure 2:
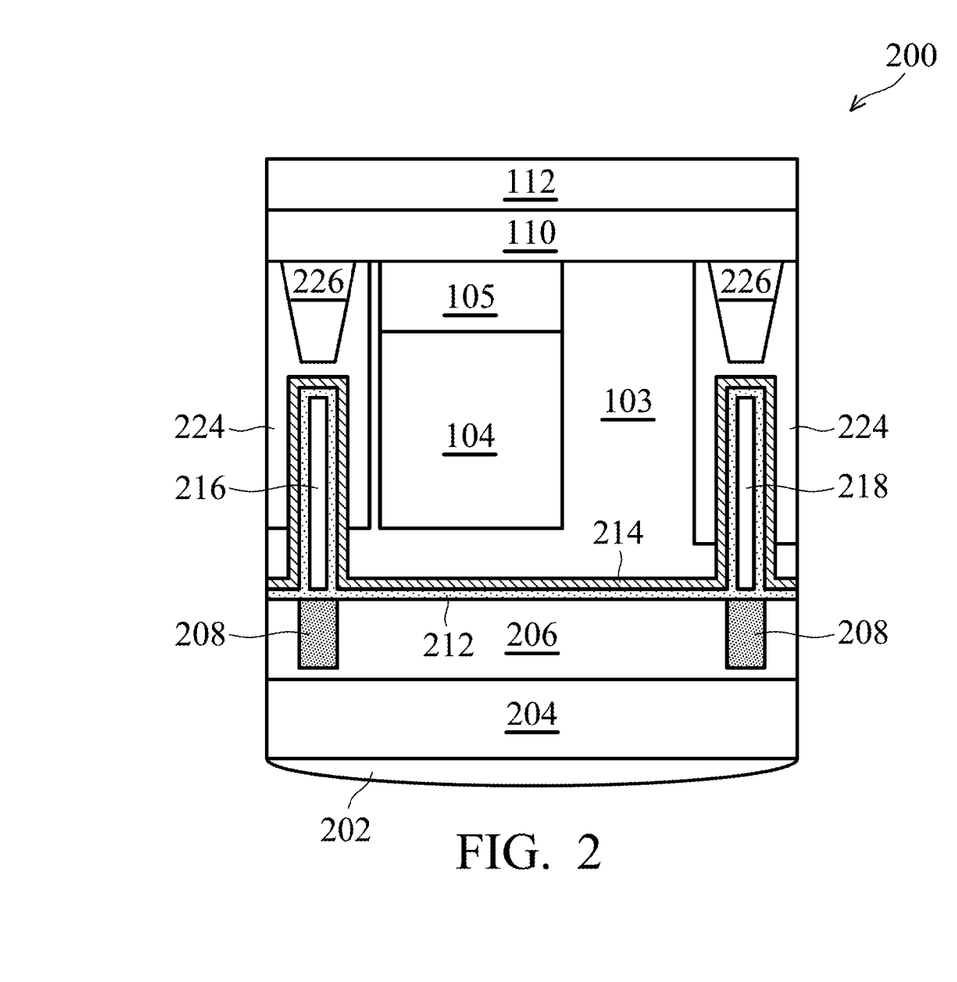
FIG. 2 illustrates in detail a cross sectional view of a backside illuminated image sensor in accordance with an embodiment.

FIG. 2 illustrates in detail a cross sectional view of a backside illuminated image sensor in accordance with an embodiment. In a backside illuminated image sensor, there may be a plurality of pixels, each of which is a photodiode formed in a silicon substrate. In accordance with an embodiment, the substrate 103 may be a p-type epitaxial layer grown from a p-type substrate (not shown). For simplicity, only one pixel is illustrated to show inventive aspects of various embodiments.

As shown in FIG. 2, the pixel 200 includes a photodiode formed by a p-type doped region 105 and an n-type doped region 104. The p-type doped region 105 may be formed by using an ion implantation process or a diffusion process from a front side of the wafer. In accordance with an embodiment, the p-type doped region 105 is doped with p-type doping materials such as boron. The doping concentration of the p-type doped region 105 is in a range from about $10^{16}/cm^3$ to about $10^{19}/cm^3$.

In accordance with an embodiment, the n-type doped region 104 may be formed by using an implantation process or a diffusion process similar to that of forming the p-type doped region 105. N-type doping materials such as phosphorus are doped into the epitaxial layer 103 to form the n-type doped region 104. In accordance with an embodiment, the front side ion implantation process or diffusion process may generate a doping concentration in a range from about $10^{16}/cm^3$ to about $10^{19}/cm^3$.

In order to avoid interference from adjacent pixels, an isolation region may be employed to prevent cross walk between adjacent pixels. The isolation region is formed by a STI structure 226, a p-well region 224 and an air gap 216. The STI structure 226 may be formed by suitable fabrication techniques. For example, the STI structure 226 may be formed by patterning the epitaxial layer 103 by photolithography, etching the epitaxial layer 103 by plasma etching so as to form STI trenches and filling the STI trenches with dielectric materials to form the STI structure 226.

The p-well region 224 is formed of P-type materials such as boron and the like. The p-well region 224 has a doping concentration of about $10^{12}/cm^3$. The p-well region 224 has a doping depth in a range from about 0 um to about 2 um. The air gap 216 is embedded in the isolation region. As shown in FIG. 2, the air gap 216 is encapsulated by an air gap dielectric layer 212. In addition, there is a negative charge film 214 is formed over the air gap dielectric layer 212. The detailed formation process of the negative charge film 214, the air gap dielectric layer 212 and the air gap 216 will be described below with respect to FIGS. 7-9.

The pixel 200 may include a metal grid 208 formed over the air gap 216. The metal grid 208 extends the light guide function of the air gap to a deeper level so that light can be reflected toward the photo active regions. As such, the quantum efficiency of the pixel 200 may be further improved as a result. The formation process of the metal grid 208 will be described in detail with respect to FIG. 10. The pixel 200 may include other layers such as color filter layer 204 and microlens layer 202, which will be discussed in detail below with respect to FIG. 11-12.

Figure 3:
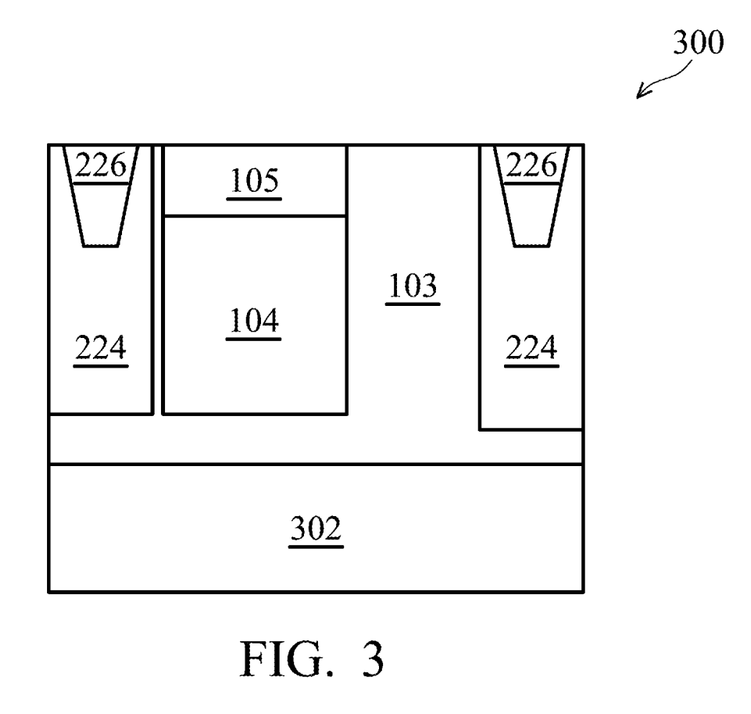
FIG. 3 is a cross sectional view of a backside illuminated image sensor wafer after a front side ion implantation process is performed on a substrate in accordance with an embodiment.

FIGS. 3-12 illustrates a method of fabricating a backside illuminated image sensor in accordance with an embodiment. FIG. 3 is a cross sectional view of a backside illuminated image sensor wafer after a front side ion implantation process is performed on a substrate in accordance with an embodiment. The backside illuminated image sensor wafer 300 comprises a substrate 302 having a first conductivity. In accordance with an embodiment, the substrate 302 is a p-type substrate. The substrate 402 may be formed of silicon, germanium, silicon germanium, graded silicon germanium, semiconductor-on-insulator, carbon, quartz, sapphire, glass, or the like, and may be multi-layered (e.g., strained layers).

A p-type epitaxial layer 103 is grown on the p-type substrate 302. In accordance with an embodiment, p-type impurity ions such as boron are implanted from the front side of the wafer into the p-type epitaxial layer 103 to form the p-type photo active region 105. In addition, n-type impurity ions such as phosphorous or arsenic are implanted from the front side of the wafer to form the n-type photo active region 104.

The backside illuminated image sensor wafer 300 may comprise a plurality of pixels (not shown), each of which comprises a PN junction formed by a p-type photo active region (e.g., photo active region 105) and an n-type photo active region (e.g., photo active region 104). In order to prevent crosstalk and interference between adjacent pixels, an isolation region including STI structure 226 and a p-well region 224 is employed to enclose the p-type photo active regions 105 and the n-type photo active region 104. The isolation region helps to prevent reflected light from adjacent pixels from reaching the photo active region 104 and the photo active region 105.

Figure 4:
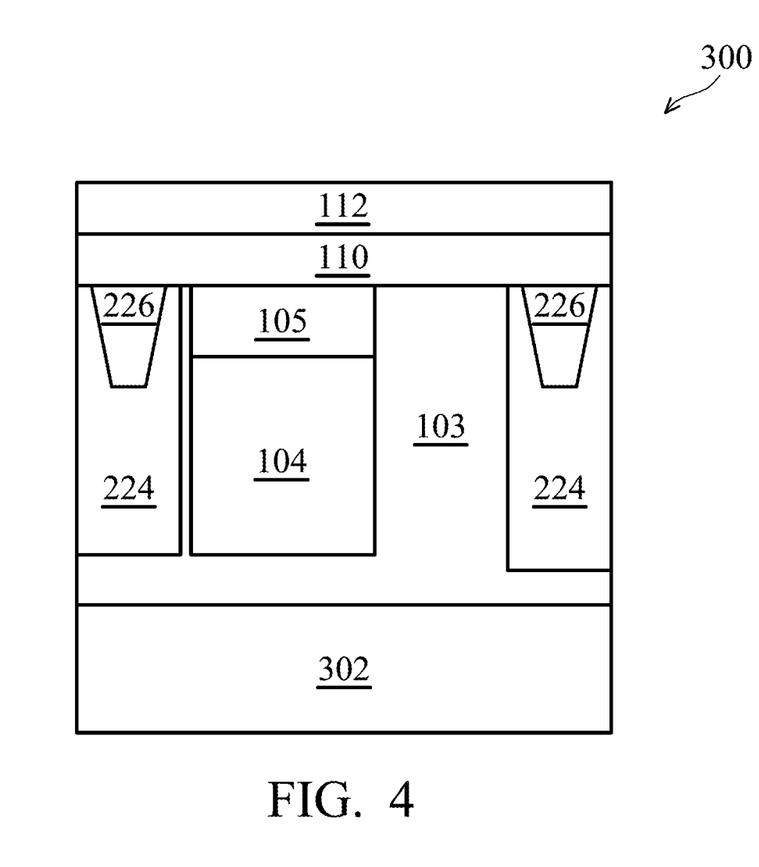
FIG. 4 illustrates a cross sectional view of the semiconductor device shown in FIG. 3 after additional front side layers have been formed over the photo active region in accordance with an embodiment.

FIG. 4 illustrates a cross sectional view of the semiconductor device shown in FIG. 3 after additional front side layers have been formed over the photo active region in accordance with an embodiment. A dielectric layer 110 is formed over the epitaxial layer 103. The dielectric layer 110 may be formed of silicon dioxide, silicon nitride and/or other suitable materials. The dielectric layer 110 may be formed using suitable techniques such as CVD, sputtering, spin-on and the like.

A metal interconnect layer 112 may be formed over the dielectric layer 110. The metal interconnect layer 112 may comprise a plurality of metal lines (not shown). The metal interconnect layer 112 provides electrical connection between the image sensor and external circuitry (not show). The metal interconnect layer 112 can be patterned by plasma etching or a damascene process and may be formed of any conductive material suitable for a particular application. Materials that may be suitable include, for example, aluminum, copper, doped polysilicon or the like.

Figure 5:
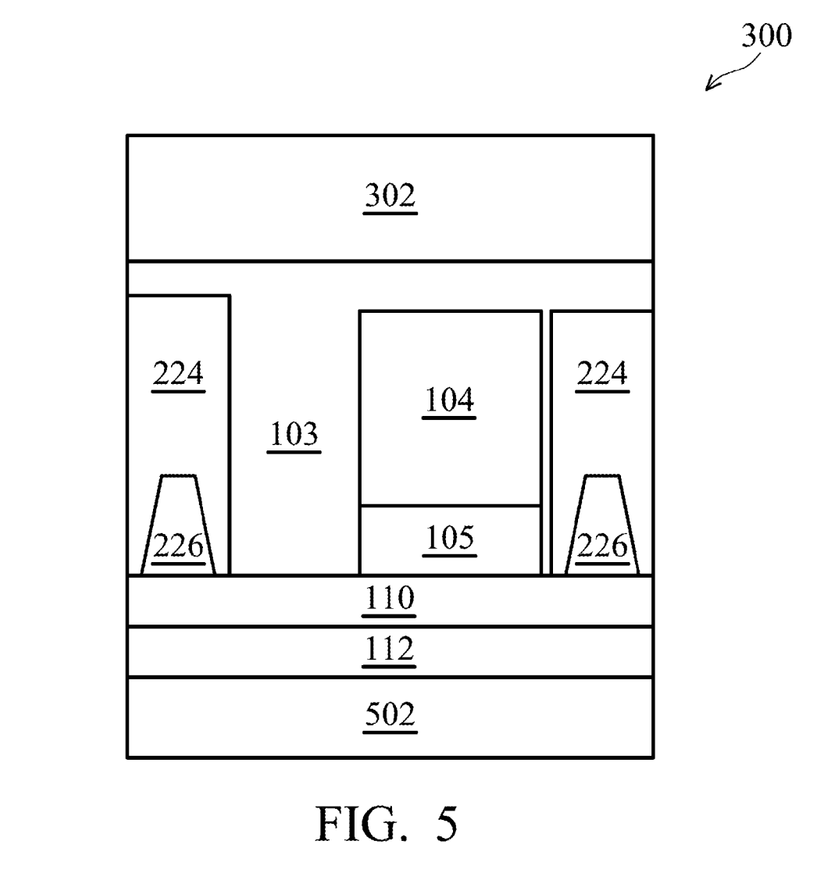
FIG. 5 is a cross sectional view of a backside illuminated image sensor wafer after the wafer is flipped and bonded on a carrier in accordance with an embodiment.

FIG. 5 is a cross sectional view of a backside illuminated image sensor wafer after the wafer is flipped and bonded on a carrier 502 in accordance with an embodiment. Once the dielectric layer 110 and the metal interconnect layer 112 are formed, the backside illuminated image sensor wafer 300 is flipped and further bounded on a silicon or glass carrier 502. In particular, the front side of the backside illuminated image sensor wafer 300 faces up toward the carrier 502. Various bonding techniques may be employed to achieve bonding between the backside illuminated image sensor wafer 300 and the carrier 502. In accordance with an embodiment, suitable bonding techniques may include adhesive bonding, vacuum bonding, anodic bonding and the like. The carrier 502 may provide sufficient mechanical support to resist forces due to a grinding step of a thinning process. The thinning process will be described below with respect to FIG. 6.

Figure 6:
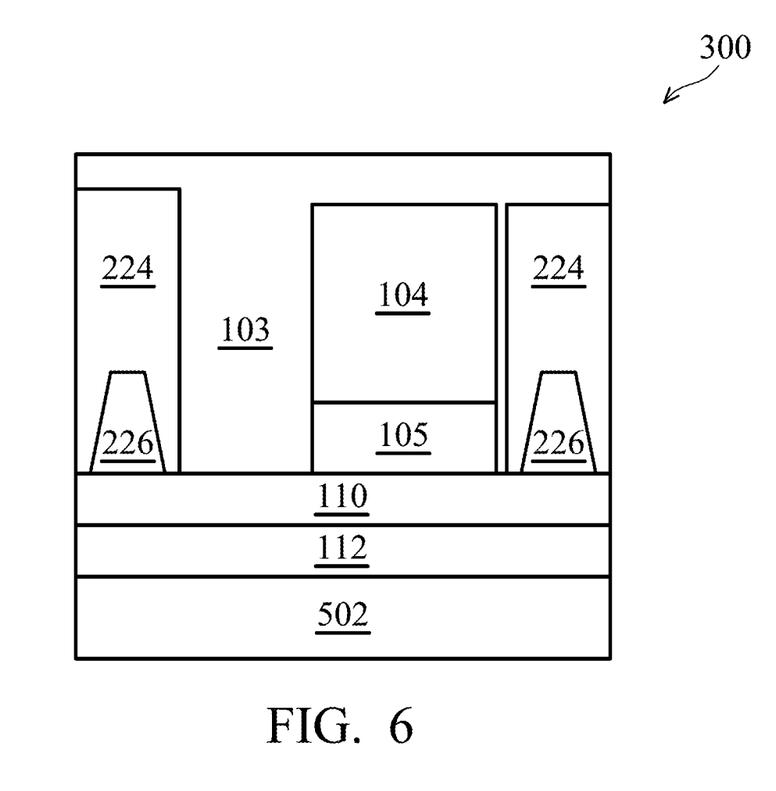
FIG. 6 is a cross sectional view of the backside illuminated image sensor wafer illustrated in FIG. 5 after a thinning process has been applied to the backside of the wafer in accordance with an embodiment.

FIG. 6 is a cross sectional view of the backside illuminated image sensor wafer illustrated in FIG. 5 after a thinning process has been applied to the backside of the wafer in accordance with an embodiment. According to the fabrication processes of backside illuminated image sensors, the substrate is thinned until the substrate 302 (illustrated in FIG. 5) is removed and the epitaxial layer 103 is exposed. More particularly the backside the substrate (e.g., the remaining of the p-type epitaxial layer 103) of the backside illuminated image sensor wafer 300 may be thinned to a thickness in a range from about 2 um to about 2.15 um. Such a thin substrate layer allows light to pass through the substrate (not shown) and hit photo diodes embedded in the substrate without being absorbed by the substrate.

The thinning process may be implemented by using suitable techniques such as grinding, polishing and/or chemical etching. In accordance with an embodiment, the thinning process may be implemented by using a chemical mechanical polishing (CMP) process. In a CMP process, a combination of etching materials and abrading materials are put into contact with the back side of the substrate and a grinding pad (not shown) is used to grind away the back side of the substrate until a desired thickness is achieved.

Figure 7:
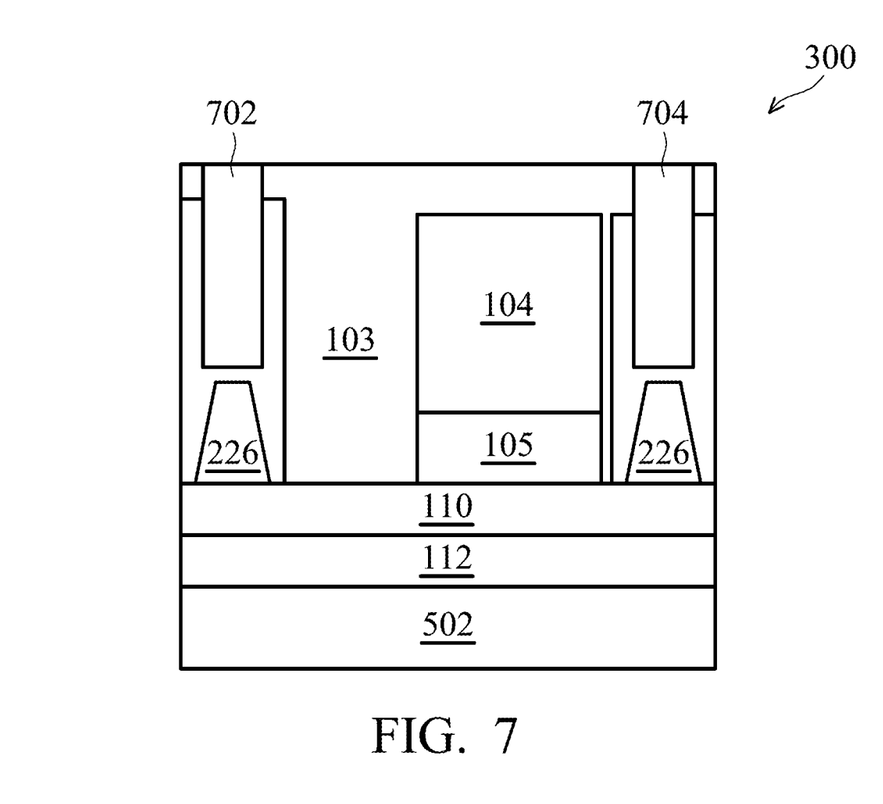
FIG. 7 illustrates a cross sectional view of the semiconductor device shown in FIG. 6 after a plurality of openings have been formed in the backside of the image sensor wafer in accordance with an embodiment.

FIG. 7 illustrates a cross sectional view of the semiconductor device shown in FIG. 6 after a plurality of openings have been formed in the backside of the image sensor wafer in accordance with an embodiment. The openings 702 and 704 may be formed using suitable techniques such as a photolithographic masking and etching process. In such a process a photoresist layer (not shown) may be deposited on the surface of the backside of the image sensor 300. The photoresist layer may be formed of suitable photoresist materials such as a deep ultra-violet photoresist material. The photoresist material may be deposited using suitable techniques such as a spin-on process.

Once the photoresist layer has been formed, the photoresist layer may be exposed to a pattern. The exposed portion of the photoresist layer may be removed by a developer. The portions of the exposed surface of the image sensor wafer may be removed to form the openings shown in FIG. 7. In accordance with an embodiment, the removal process may be implemented by using a suitable etching process such as an anisotropic etch using an etchant such as ammonium fluoride/hydrogen fluoride or ammonium fluoride/acetic acid, although any other suitable removal process may be alternatively utilized.

Figure 8:
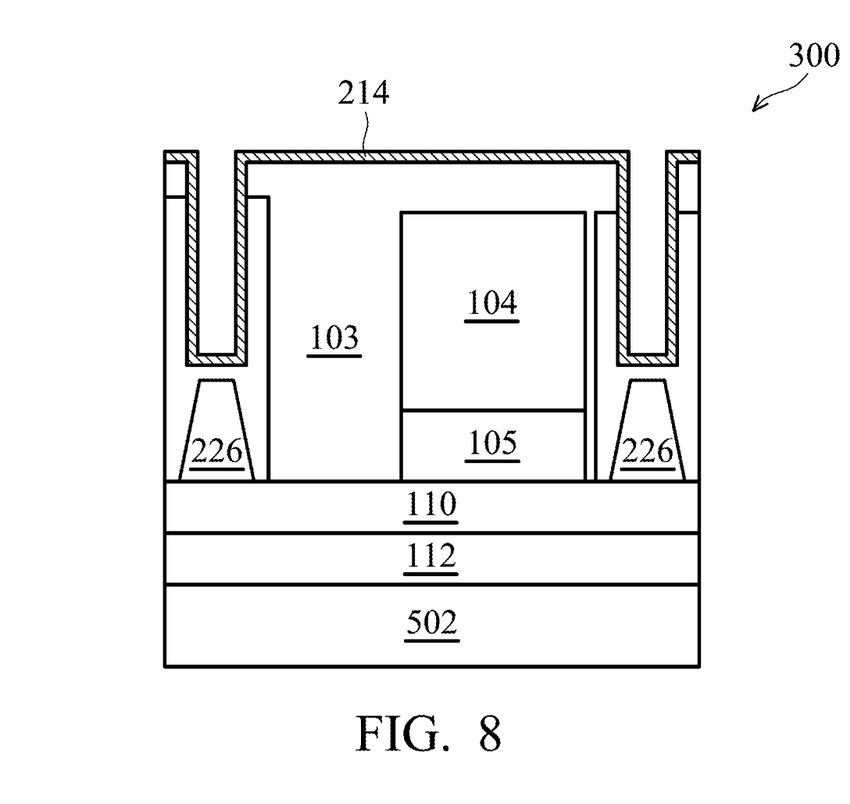
FIG. 8 is a cross sectional view of the backside illuminated image sensor wafer illustrated in FIG. 7 after a negative charge layer has been applied in accordance with an embodiment.

FIG. 8 is a cross sectional view of the backside illuminated image sensor wafer illustrated in FIG. 7 after a negative charge layer has been applied in accordance with an embodiment. As shown in FIG. 8, a thin negative charge layer is deposited on the bottom of the opening, sidewalls of the opening and the top surface of the backside of the image sensor through suitable deposition processes such as a conformal coating process. The negative charge layer 214 may comprise suitable dielectric materials such as $Al_2O_3$, $HfO_2$, $ZrO_2$, $Ta_2O_5$ or $TiO_2$, which can induce a high concentration of negative charges. One advantageous feature of having the negative charge layer 214 is that the high concentration of negative charges helps to prevent electrons from being trapped near the isolation region so as to reduce leakage current as well as cross talk between neighboring image sensor pixels.

Figure 9:
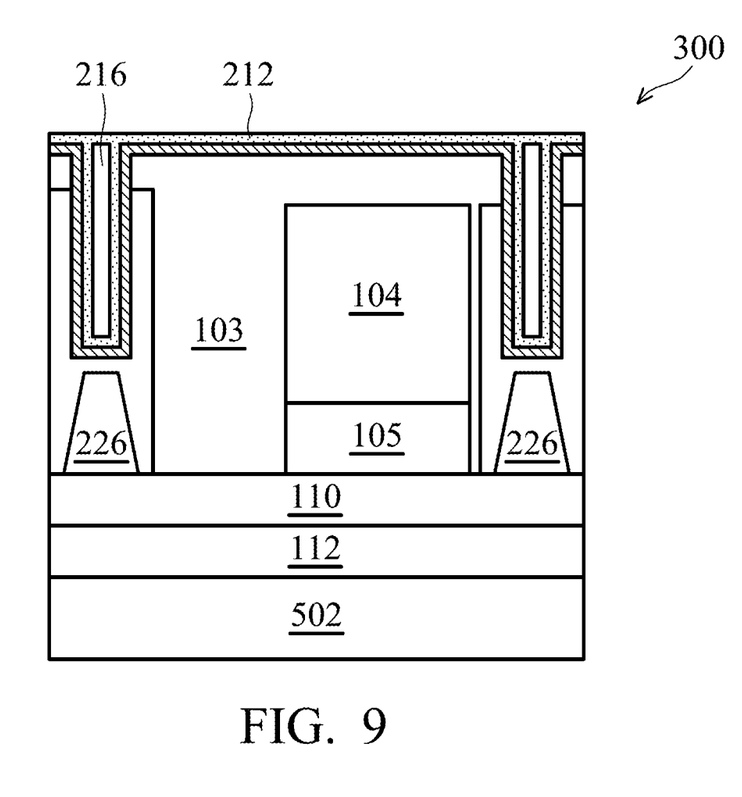
FIG. 9 is a cross sectional view of the backside illuminated image sensor wafer illustrated in FIG. 8 after an oxide layer has been applied to the backside of the wafer in accordance with an embodiment.

FIG. 9 is a cross sectional view of the backside illuminated image sensor wafer illustrated in FIG. 8 after an oxide layer has been applied to the backside of the wafer in accordance with an embodiment. As shown in FIG. 9, the air gap dielectric layer 212 may be employed to cover the openings. In accordance with an embodiment, the air gap dielectric layer 212 may comprise suitable dielectric materials such as oxide, silicon nitride or silicon carbide. The air gap dielectric layer 212 may be formed using a deposition process such as CVD or PECVD, or the like. More particularly, by controlling the deposition process, the material of the air gap dielectric layer 212 may be deposited in a non-conformable manner. In other words, the materials of the air gap dielectric layer 212 builds up on the upper terminal of the opening faster than along the sidewalls and the bottom of the opening. This process leads to the formation of an overhang at the edge of the upper terminal of the opening and, as the deposition process continues, the overhangs will merge, thereby sealing off the upper terminal of the opening.

Figure 10:
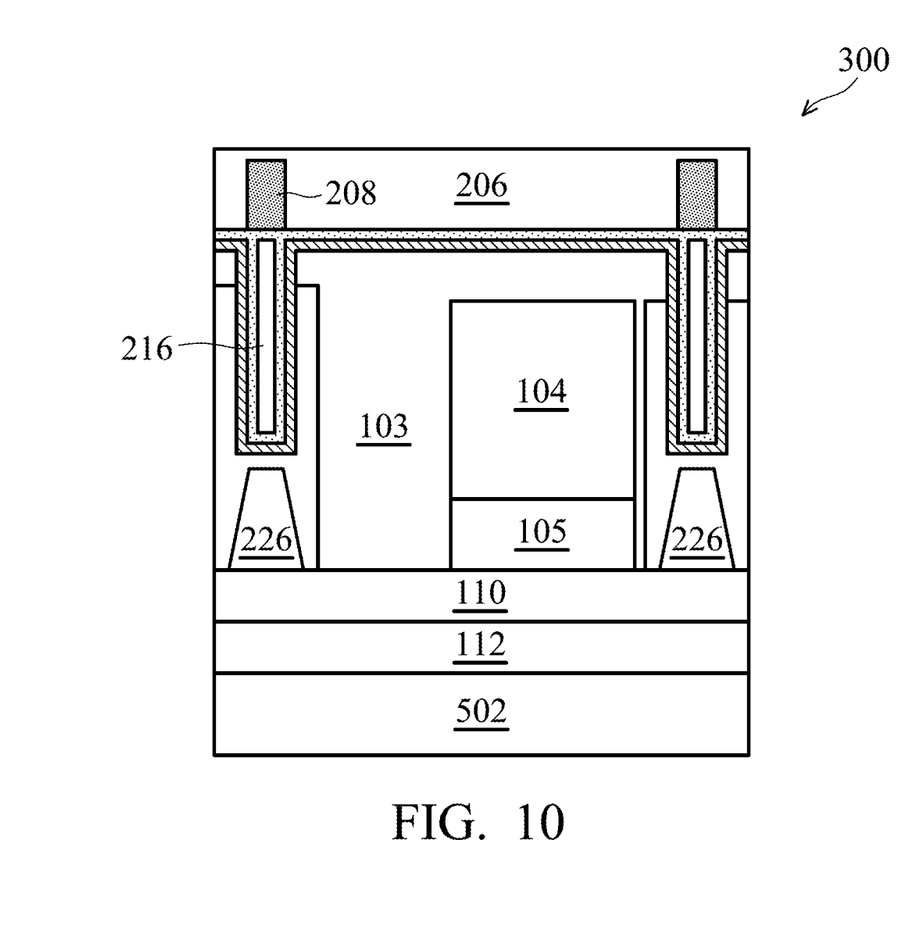
FIG. 10 is a cross sectional view of the backside illuminated image sensor wafer illustrated in FIG. 9 after a plurality of metal grids have been formed over the oxide layer in accordance with an embodiment.

FIG. 10 is a cross sectional view of the backside illuminated image sensor wafer illustrated in FIG. 9 after a plurality of metal grids have been formed over the oxide layer in accordance with an embodiment. As shown in FIG. 10, the metal grid 208 may be formed in a dielectric layer 206. The dielectric layer 206 may be formed of suitable materials such as silicon oxide. The dielectric layer 206 may be formed through a process such as CVD, PECVD, thermal oxidation, combinations of these, or the like.

Once the dielectric layer 206 is deposited, the metal grid 208 may be formed by forming openings within the dielectric layer 206. The openings may be formed using suitable techniques such as a suitable photolithographic masking and etching process. The detailed process of forming openings is similar to that described above with respect to FIG. 7, and hence is not discussed in further detail herein.

Once the openings have been formed, the openings may be filled with metal materials to form the metal grid 208. In accordance with an embodiment, the metal materials filled in the openings include copper, aluminum, tantalum, titanium nitride, combinations thereof or the like. In accordance with an embodiment, the metal materials may be filled in the opening using a suitable deposition process such as CVD, PECVD, ALD, electroplating and/or the like. Once the metal material has filled and overfilled the openings, excess amounts of the metal material outside of the openings may be removed using a suitable planarization technique such as CMP.

After the metal grid 208 has been formed within the opening of the dielectric layer 206. Additional dielectric materials may be formed over the metal grid 208 to encapsulate the metal grid 208. In accordance with an embodiment, the additional dielectric material formed over the metal grid 208 may be a similar material as the dielectric layer 206 (e.g., silicon oxide). As shown in FIG. 10, by depositing additional dielectric materials over the metal grid 208, the metal grid 208 is embedded in a dielectric layer. The additional dielectric material may be deposited using a suitable deposition process such as CVD, PECVD, combinations thereof or the like.

In accordance with an embodiment, the metal grid 208 is of a height more than 5000 Å. In addition, the metal grid 208 is of a width more than the width of the air gap 216. As shown in FIG. 10, the metal grid 208 is formed on top of the air gap 216. In particular, the metal grid 208 is vertically aligned with the air gap 216.

One advantageous feature of having an air gap formed in the isolation region and a metal grid formed over the air gap is that the air gap and the metal grid operate similar to a minor. In other words, the air gap and the metal grid may be used as a light guide to reflect light striking the isolation region. In addition, the air gap and the metal grid may help to improve the refractive index of the isolation region. As a result, the improved refractive index may help to generate more electrons in response to the incoming light. In sum, by employing the air gap and the metal grid, cross-talk between adjacent pixels may be reduced. As such, the overall efficiency of the image sensor 300 may be improved.

Figure 11:
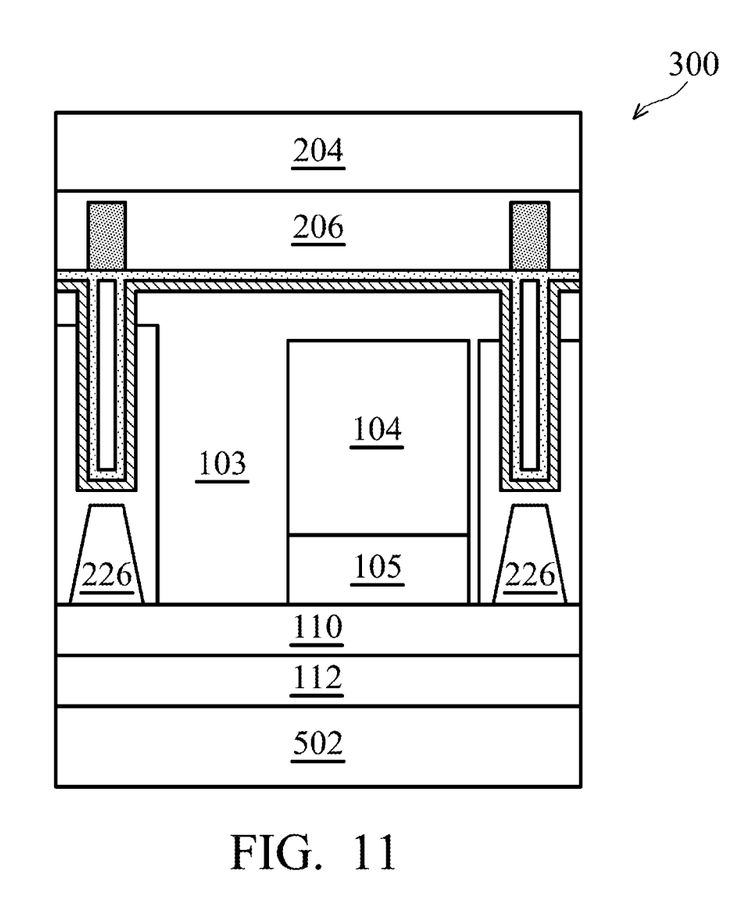
FIG. 11 is a cross sectional view of the backside illuminated image sensor wafer illustrated in FIG. 10 after a color filter layer has been applied in accordance with an embodiment.

FIG. 11 is a cross sectional view of the backside illuminated image sensor wafer illustrated in FIG. 10 after a color filter layer has been applied in accordance with an embodiment. The color filter layer 204 may be used to allow specific wavelengths of light to pass while reflecting other wavelengths, thereby allowing the image sensor to determine the color of the light being received by the photo active region (e.g., photo active regions 104 and 105). The color filter layer 204 may vary, such as a red, green, and blue filter. Other combinations, such as cyan, yellow, and magenta, may also be used. The number of different colors of the color filters 204 may also vary.

In accordance with an embodiment, the color filter layer 204 may comprise a pigmented or dyed material, such as an acrylic. For example, polymethyl-methacrylate (PMMA) or polyglycidylmethacrylate (PGMS) are suitable materials with which a pigment or dye may be added to form the color filter layer 204. Other materials, however, may be used. The color filter layer 204 may be formed by any suitable method known in the art.

Figure 12:
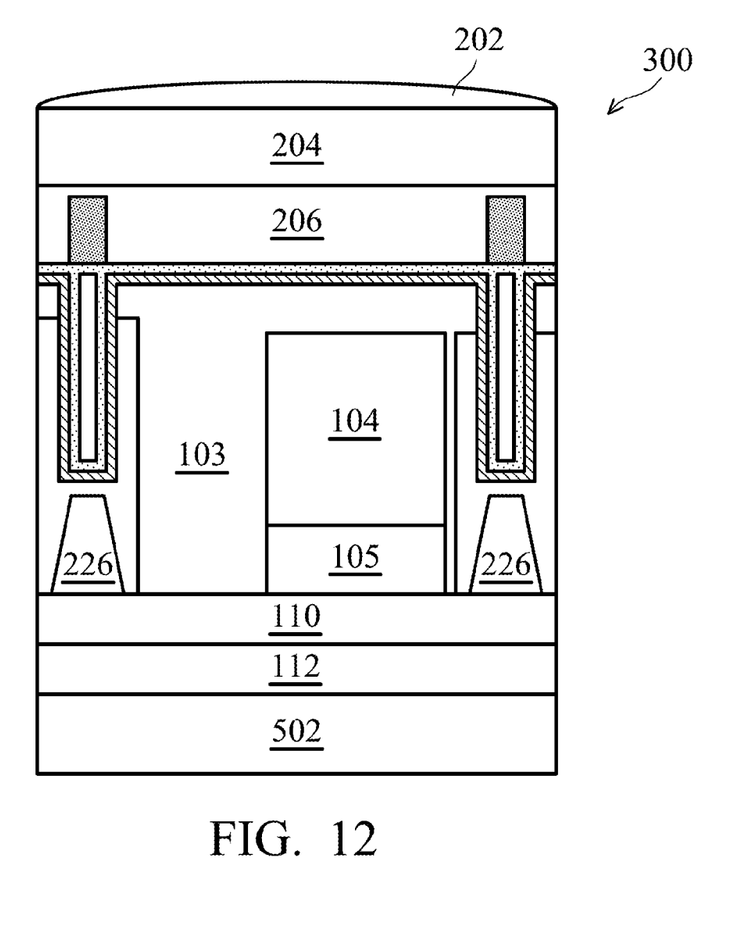
FIG. 12 is a cross sectional view of the backside illuminated image sensor wafer illustrated in FIG. 11 after a mircolens layer has been applied in accordance with an embodiment.

FIG. 12 is a cross sectional view of the backside illuminated image sensor wafer illustrated in FIG. 11 after a mircolens layer has been applied in accordance with an embodiment. The microlens layer 202 may be formed of any material that may be patterned and formed into lenses, such as a high transmittance, acrylic polymer. The microlens layer 202 is about 0.1 um to about 2.5 um in thickness. In accordance with an embodiment, the microlens layer 202 may be formed using a material in a liquid state and spin-on techniques known in the art. This method has been found to produce a substantially planar surface and a microlens layer 202 having a substantially uniform thickness, thereby providing greater uniformity in the microlenses. Other methods, such as deposition techniques like CVD, PVD or the like, may also be used.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
a substrate having a first side and a second side, wherein the first side is adjacent to a photo active region;
an isolation region disposed adjacent to the photo active region in the first side of the substrate;
an air gap embedded in the isolation region, wherein the air gap is encapsulated by a dielectric material, and wherein the air gap is adjacent to the second side of the substrate, and wherein a bottom of the air gap is lower than a bottom of the photo active region with reference to the second side; and a negative charge layer along sidewalls of the air gap.

2. The apparatus of claim 1, further comprising:
an air gap covering layer formed over the second side of the substrate;
a metal grid holding layer formed on the air gap covering layer;
a color filter layer formed on the metal grid holding layer; and
a microlens layer formed on the color filter layer.

3. The apparatus of claim 2, further comprising:
a metal grid formed in the metal holding layer, wherein the metal grid is vertically aligned with the air gap.

4. The apparatus of claim 1, further comprising:
an epitaxial layer grown in the substrate;
the photo active region embedded in the epitaxial layer;
a dielectric layer formed on the epitaxial layer over the first side of the substrate; and
an interconnect layer formed on the dielectric layer.

5. A device comprising:
a substrate with a first conductivity;
an epitaxial layer formed on the substrate;
a first photo active region having a second conductivity formed in a first side of the substrate;
a second photo active region having the first conductivity formed in the first side of the substrate;
an isolation region, wherein the first photo active region and the second photo active region are enclosed by the isolation region;
an air gap in the isolation region, wherein a bottom of the air gap is deeper than the first photo active region and the second photo active region with reference to the first side of the substrate; and
an air gap covering layer on an opening of the air gap.

6. The device of claim 5, wherein:
the first conductivity is p-type; and
the second conductivity is n-type.

7. The device of claim 5, further comprising:
a negative charge layer in the air gap in a conformable manner.

8. The device of claim 7, wherein:
the negative charge layer is formed of $Al_2O_3$, $ZrO_2$, $HfO_2$, $Ta_2O_5$, $TiO_2$ or any combination thereof.

9. The device of claim 5, further comprising:
a color filter layer on the air gap covering layer; and
a microlens layer on the color filter layer.

10. The device of claim 5, further comprising:
a metal grid holding layer deposited over a second side of the substrate; and
a metal grid formed in the metal grid holding layer.

11. The device of claim 10, wherein
the metal grid is vertically aligned with the air gap.

12. The device of claim 10, wherein:
the metal grid holding layer is formed of silicon oxide.

13. A structure comprising:
an epitaxial layer over a substrate;
a photodiode in the epitaxial layer, wherein the photodiode is adjacent to a front side of the epitaxial layer; and
an isolation region surrounding the photodiode, wherein the isolation region comprises an air gap structure, and wherein a bottom of the air gap structure is deeper than the photodiode with reference to the front side.

14. The structure of claim 13, wherein:
the air gap structure comprises a negative charge film, an air gap dielectric layer and an air gap.

15. The structure of claim 14, wherein:
the air gap is encapsulated by the air gap dielectric layer.

16. The structure of claim 14, wherein:
the air gap is embedded in the isolation region.

17. The structure of claim 13, further comprising:
a shallow trench isolation region overlying the air gap structure.

18. The structure of claim 13, wherein:
the photodiode comprises a p-type photo active region and an n-type photo active region, and wherein the p-type photo active region is adjacent to the front side of the epitaxial layer.

19. The structure of claim 13, wherein:
the epitaxial layer is a p-type epitaxial layer.

20. The structure of claim 13, wherein:
the isolation region is formed of a p-type semiconductor material.

* * * * *